United States Patent
Haider et al.

(10) Patent No.: US 10,354,858 B2
(45) Date of Patent: Jul. 16, 2019

(54) PROCESS FOR FORMING PZT OR PLZT THINFILMS WITH LOW DEFECTIVITY

(71) Applicant: Texas Instruments Incorporated, Dallas, TX (US)

(72) Inventors: Asad Mahmood Haider, Plano, TX (US); John Britton Robbins, McKinney, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 575 days.

(21) Appl. No.: 14/467,688

(22) Filed: Aug. 25, 2014

(65) Prior Publication Data
US 2015/0187570 A1    Jul. 2, 2015

Related U.S. Application Data

(60) Provisional application No. 61/922,175, filed on Dec. 31, 2013.

(51) Int. Cl.
  *B05D 3/12*   (2006.01)
  *H01L 21/02*  (2006.01)
  *H01L 21/67*  (2006.01)
  *B05D 1/00*   (2006.01)
  *H01L 49/02*  (2006.01)

(52) U.S. Cl.
  CPC ........ *H01L 21/02087* (2013.01); *B05D 1/005* (2013.01); *H01L 21/0206* (2013.01); *H01L 21/02197* (2013.01); *H01L 21/02282* (2013.01); *H01L 21/02334* (2013.01); *H01L 21/6715* (2013.01); *H01L 28/55* (2013.01)

(58) Field of Classification Search
  CPC .............. B05D 1/005; H01L 21/02087; H01L 21/6715; H01L 21/02334; H01L 21/02343; H01L 21/02282; H01L 28/55; H01L 21/02197; H01L 21/0206
  USPC .......................... 427/240, 425; 438/780, 782
  See application file for complete search history.

(56) References Cited

U.S. PATENT DOCUMENTS

| | | | | |
|---|---|---|---|---|
| 5,084,483 A * | 1/1992 | Yamashita | ............... | G03F 7/162 427/345 |
| 5,711,809 A * | 1/1998 | Kimura | ............... | B05B 15/0406 118/319 |
| 6,503,568 B1 * | 1/2003 | Oota | ....................... | G03F 7/162 118/712 |
| 2012/0100330 A1* | 4/2012 | Soyama | ............ | H01L 21/02087 428/78 |
| 2012/0171364 A1* | 7/2012 | Haider | .................... | H01L 27/20 427/100 |

* cited by examiner

*Primary Examiner* — Kirsten Jolley
(74) *Attorney, Agent, or Firm* — Jacqueline J. Garner; Charles A. Brill; Frank D. Cimino

(57) ABSTRACT

Use of a non-solvent for the edge bead removal of spin-coated PZT or PLZT thinfilms, eliminates swelling of the exposed edges of the PZT or PLZT thinfilms and eliminates delamination and formation of particle defects in subsequent bake and anneal steps.

11 Claims, 2 Drawing Sheets

PROCESS FOR FORMING PZT OR PLZT THINFILMS WITH LOW DEFECTIVITY

CROSS-REFERENCE TO RELATED APPLICATIONS

This application claims the benefit of priority under U.S.C. § 119(e) of U.S. Provisional Application 61/922,175, filed Dec. 31, 2013.

FIELD OF THE INVENTION

This invention relates to the field of integrated circuits. More particularly, this invention relates to forming PZT and PLZT thinfilms.

BACKGROUND OF THE INVENTION

PZT (lead zirconate titanate) and PLZT (lead lanthanum zirconate titanate) films are used in integrated circuit to form the dielectric in high performance capacitors. These films are typically formed using sol-gel technology.

Sol-gel spin coating technology is frequently used for the fabrication of metal oxides such as PZT and PLZT using metal alkoxide precursors. A solution (sol) containing the metal alkoxide precursors is spin coated onto the wafer to form a thinfilm of PZT or PLZT with uniform thickness. A low temperature bake is then performed to remove some of the solvent and to convert the metal alkoxides to a gel. During this step significant densification and shrinkage may occur. A final high temperature anneal may be performed to cause chemical reactions converting the metal alkoxides to metal oxides.

Formation of a PZT or PLZT capacitor dielectric film is accomplished using a spin coater such as is shown in FIG. 1. A wafer 106 is placed on the spinner 102 and the PZT or PLZT containing solution is dispensed onto the center of the wafer through a nozzle 104. The wafer 106 is then spun at high speed to distribute the PZT or PLZT containing solution across the wafer to form a thinfilm of PZT or PLZT with uniform thickness. The nozzle 104 then moves to the edge of the wafer and a solvent such as butanol which dissolves PZT or PLZT is used to remove the PZT or PLZT thinfilm from the edge of the wafer (edge-bead removal). Edge bead removal eliminates the formation of particles at the edge of the wafer that cause defects and reduce yield.

During the edge bead removal process some of the solvent such as butanol is adsorbed into the exposed edge of the PZT or PLZT thinfilm causing it to swell. During the subsequent bake and anneal, the swelled PZT or PLZT thinfilm may delaminate resulting in particle defects and reduced yield.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

Use of a non-solvent for the edge bead removal of spin-coated PZT or PLZT thinfilms, eliminates swelling of the exposed edges of the PZT or PLZT thinfilms and eliminates delamination and formation of particle defects in subsequent bake and anneal steps.

DETAILED DESCRIPTION

Figure 1:
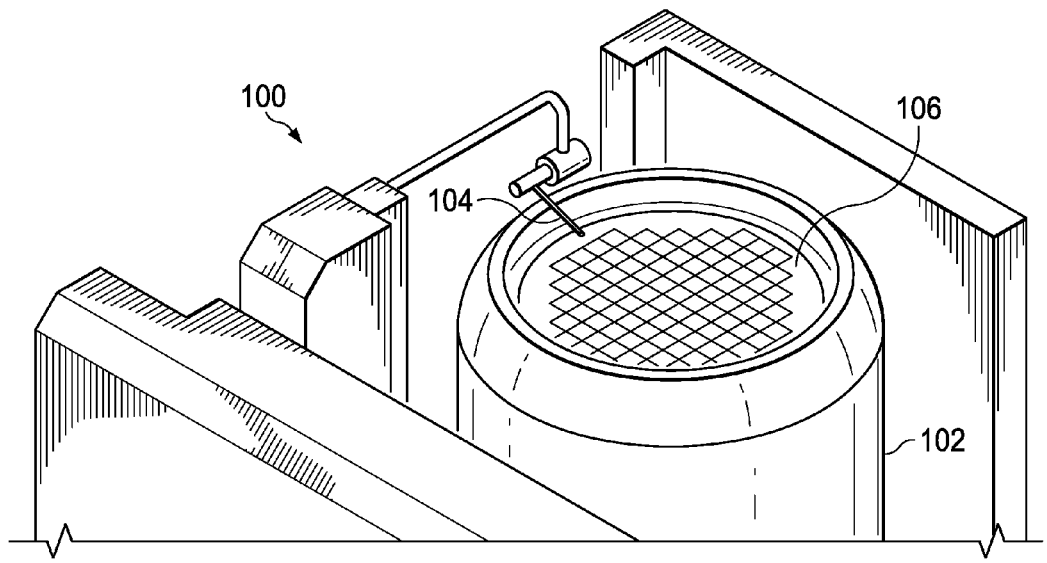
FIG. 1 (Prior Art) Spin coater with edge bead removal nozzle.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Liquids may be classified as solvents and non-solvents. Typically polar solvents such as water dissolve ionic materials such as salt (water is a solvent for salt) but do not dissolve non-ionic materials such as glue residue (water is a non-solvent for glue residue.) In contrast non polar solvents such as mineral spirits dissolve non-ionic materials such as glue residue (mineral spirits are a solvent for glue residue) but do not dissolve ionic materials such as salt (mineral spirits are a non-solvent for salt.)

The term solvent is used to describe a liquid that dissolves a lead zirconate titanate thinfilm (PZT) or a lead lanthanum zirconate titanate (PLZT) thinfilm which has been spin-coated on a wafer.

The term non-solvent is used to describe a liquid that does not dissolve a PZT or a PLZT thinfilm which has been spin-coated on a wafer.

A sol-gel process is typically used to form the lead zirconate titanate (PZT) or lead lanthanum zirconate titanate (PLZT) thinfilm dielectric for high performance capacitors in integrated circuits. PZT or PLZT containing solutions are spin-coated onto the integrated circuit wafer using a spin-coater such as is shown in FIG. 1. The PZT or PLZT containing solution is deposited on the center of the wafer through a nozzle 104 and then the wafer is spun at high speed to uniformly distribute the PZT or PLZT containing solution across the wafer 106 to form a thin film of PZT or PLZT with uniform thickness.

Edge bead removal is then performed to remove a small strip of the PZT or PLZT thinfilm from the edge of the wafer to reduce particle defect formation in subsequent processing steps. The nozzle 104 is moved to the edge of the wafer 106 and a stream of liquid is directed at the edge of the wafer to remove the PZT or PLZT edge bead.

Typically, a solvent such as butanol which dissolves the PZT or PLZT thinfilm is used for edge bead removal. The exposed edge of the PZT or PLZT thinfilm absorbs some of the butanol causing the outside edge of the PZT or PLZT thinfilm to swell. During subsequent bake and anneal the swelled PZT or PLZT material may delaminate forming particle defects decreasing yield.

After trying many alternate PZT or PLZT solvents for edge bead removal the surprising discovery was made that a non-solvent such as deionized (DI) water, removes the PZT or PLZT thinfilm edge bead and does not cause the exposed edge of the PZT or PLZT thinfilm to swell. A jet of nonsolvent such as DI water from the nozzle 104 (FIG. 1) directed at the edge of the wafer physically removes (rather than chemically by dissolving) the PZT or PLZT thinfilm edge bead. DI water has the additional advantage of evaporating from the wafer edge and the exposed edge of the PZT or PLZT thinfilm without leaving residue and without causing swelling or degradation of exposed edge. DI water is also is more cost effective than the PZT or PLZT solvents typically used and does not incur hazardous waste disposal costs.

Alternatively an aqueous solution of greater than 50% by volume DI water with a solvent such as butanol or isopropyl alcohol may be used for edge bead removal of the PZT or PLZT thinfilm. These aqueous solutions reduce swelling of the exposed edge of the PZT or PLZT thinfilm and eliminate particle defect formation. These solutions are more costly than pure DI water for edge bead removal so pure DI water is preferred.

Figure 2:
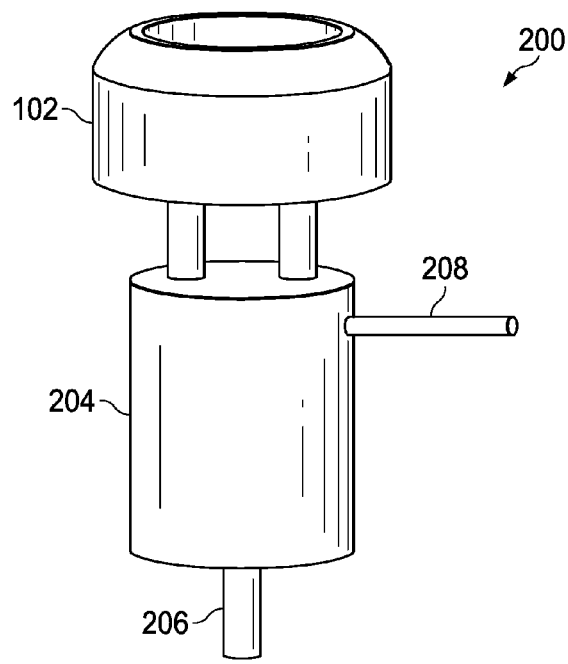
FIG. 2 (Prior Art) Spin coater spin cup and coater reservoir.

An additional problem may arise when using DI water or a nonsolvent containing greater than 50% DI water by volume to remove the PZT or PLZT edge bead. When DI water and the PZT or PLZT thinfilm edge bead material mix in a ratio greater than about 45% DI water by volume, a metal hydrate precipitate may form. This precipitate may form in the coater reservoir, 204, (FIG. 2) and clog the solvent drain, 206. Addition of a PZT or PLZT solvent such as acetone, methanol, butanol, or isopropyl alcohol (IPA) to the coater reservoir 204 to reduce the ratio or DI water to less than about 45% by volume prevents the precipitate from forming. In one embodiment, for every 10 ml of water used for PZT or PLZT edge bead removal, at least 1 ml of acetone is introduced to the coater reservoir 206 through tube 208. In another embodiment, for every 10 ml of water used for PZT or PLZT edge bead removal, at least 2 ml of methanol is introduced into the coater reservoir. In yet another embodiment, for every 10 ml of water used for PZT or PLZT edge bead removal, at least 7 ml of IPA is added.

Figure 3:
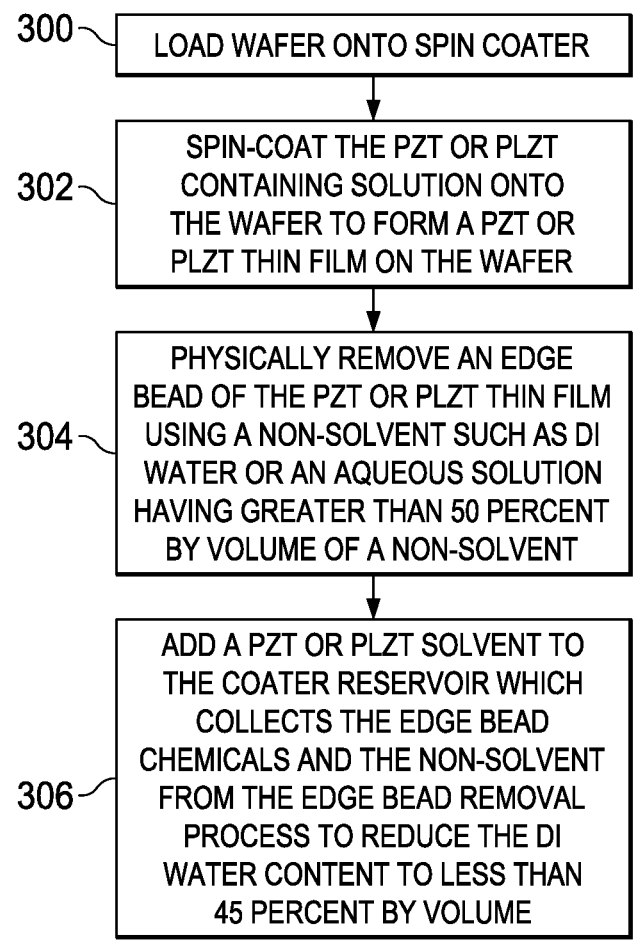
FIG. 3 A flow diagram illustrating a process for forming a PZT or PLZT thinfilm with low defectivity.

An embodiment process for forming PZT or PLZT thinfilm with reduced defects is described in the flow chart shown in FIG. 3. The partially processed integrated circuit wafer is loaded on the spin coater in step 300.

In step 302 the PZT or PLZT containing solution is dispensed onto the wafer and spun to distribute the solution across the wafer to form a t PZT or PLZT thinfilm with uniform thickness.

Referring now to step 304, a jet of non-solvent solution, for example DI water or an aqueous solution having greater than 50% of a non-solvent, is directed at the edge of the wafer to physically remove (rather than chemical dissolving) the PZT or PLZT from the edge of the wafer (edge bead removal).

The chemical mixture of non-solvent plus removed PZT or PLZT edge bead material collects in the coater reservoir 204 (FIG. 2) beneath the wafer 106 (FIG. 1). If the DI water content of this mixture is greater than about 45% by volume a metal hydrate may form and block the drain 206.

In step 306 a solvent is added to the coater reservoir to reduce the DI water to less than about 45% by volume to avoid formation of a metal hydrate.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps:
   forming a thin film containing lead, zirconium, titanium, and oxygen by spin coating a solution containing the lead, zirconium, titanium, and oxygen onto a wafer using a spin-coating tool;
   removing an edge bead of the thin film by directing a jet of non-solvent onto an edge of the wafer through an edge bead removal nozzle in the spin-coating tool;
   collecting the non-solvent and edge bead material in a coater reservoir after directing the jet of non-solvent onto the edge of the wafer; and
   adding a first solvent to non-solvent and edge bead material collected in the coater reservoir to reduce the non-solvent volume percent to less than 45% of the volume of the total mixture of the first solvent, the non-solvent, and the edge bead material collected in the coater reservoir.

2. The process of claim 1 wherein the thin film is a lead zirconate titanate (PZT) thin film.

3. The process of claim 1 wherein the thin film further includes lanthanum and is a lead lanthanum zirconate titanate (PLZT) thin film.

4. The process of claim 1 wherein the non-solvent is DI water.

5. The process of claim 1 wherein the non-solvent is DI water and is present in an aqueous solution including a second solvent wherein a volume of DI water in the aqueous solution is greater than 50%.

6. The process of claim 5 wherein the second solvent is butanol.

7. The process of claim 5, wherein the second solvent is isopropyl alcohol.

8. The process of claim 1, wherein said first solvent is selected from the group consisting of acetone, methanol, butanol, and isopropyl alcohol.

9. A process of forming an integrated circuit, comprising the steps:
   forming a thin film containing lead, zirconium, titanium, and oxygen by spin coating a solution containing the lead, zirconium, titanium, and oxygen onto a wafer using a spin-coating tool;
   directing a jet of deionized (DI) water onto an edge of the wafer through an edge bead removal nozzle in the spin-coating tool to physically remove an edge bead of the thin film without chemically attacking the thin film;
   collecting the DI water plus edge bead material in a coater reservoir below the wafer after directing the jet of DI water onto the edge of the wafer, and adding a solvent to the DI water plus the edge bead material collected in the coater reservoir of the spin-coating tool in order to reduce the DI water volume percent to less than 45% of the volume of the total mixture of the solvent, the DI water, and the edge bead material collected in the coater reservoir.

10. A process of forming an integrated circuit, comprising the steps:

forming a thin film containing lead, zirconium, titanium, and oxygen by spin coating a solution containing the lead, zirconium, titanium, and oxygen onto a wafer using a spin-coating tool;

removing an edge bead of the thin film by directing a jet of aqueous solution comprising a first solvent and at least 50% by volume of a non-solvent onto an edge of the wafer through an edge bead removal nozzle in the spin-coating tool; and adding a second solvent to the aqueous solution plus the edge bead material collected in a coater reservoir of the spin-coating tool below the wafer in order to reduce the non-solvent volume percent to less than 45% of the volume of the total mixture of the second solvent, the first solvent, the non-solvent, and the edge bead material collected in the coater reservoir.

11. The process of claim 10, wherein the non-solvent comprises deionized (DI) water.

* * * * *